US012575351B2

(12) United States Patent
Takata et al.

(10) Patent No.: US 12,575,351 B2
(45) Date of Patent: Mar. 10, 2026

(54) ETCHING METHOD AND PLASMA PROCESSING APPARATUS

(71) Applicant: Tokyo Electron Limited, Tokyo (JP)

(72) Inventors: Fumiya Takata, Miyagi (JP); Shota Yoshimura, Miyagi (JP); Shinya Morikita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 910 days.

(21) Appl. No.: 17/842,791

(22) Filed: Jun. 17, 2022

(65) Prior Publication Data

US 2022/0406613 A1    Dec. 22, 2022
US 2024/0162045 A9    May 16, 2024

(30) Foreign Application Priority Data

Jun. 22, 2021    (JP) ................................. 2021-102876
Oct. 20, 2021    (JP) ................................. 2021-171587
Dec. 16, 2021    (JP) ................................. 2021-204527
May 23, 2022    (JP) ................................. 2022-083897

(51) Int. Cl.
*H01L 21/311*    (2006.01)
*H01J 37/32*    (2006.01)
*H01L 21/02*    (2006.01)

(52) U.S. Cl.
CPC .. *H01L 21/31116* (2013.01); *H01L 21/02126* (2013.01); *H01J 37/32091* (2013.01); *H01J 37/32449* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 10,847,377 B2 * | 11/2020 | Dole | ................. H01L 21/32133 |
| 12,198,937 B2 * | 1/2025 | Chino | .............. H01J 37/32449 |
| 2019/0362984 A1 * | 11/2019 | Katsunuma | ....... H01L 21/02238 |
| 2020/0126804 A1 * | 4/2020 | Dole | ................. H01L 21/32133 |

FOREIGN PATENT DOCUMENTS

| | | |
|---|---|---|
| JP | 2016-157793 A | 9/2016 |
| JP | 2019-207911 A | 12/2019 |
| WO | 2020/096817 A | 5/2020 |

* cited by examiner

*Primary Examiner* — Michelle Mandala
(74) *Attorney, Agent, or Firm* — XSENSUS LLP

(57) ABSTRACT

An etching method includes: preparing a substrate including a first region containing silicon and nitrogen, and a second region containing silicon and oxygen; and etching the second region while firming a tungsten-containing protective layer on the first region, by exposing the first and second regions to plasma generated from a processing gas containing carbon, fluorine, and tungsten.

18 Claims, 12 Drawing Sheets

Figure 3:
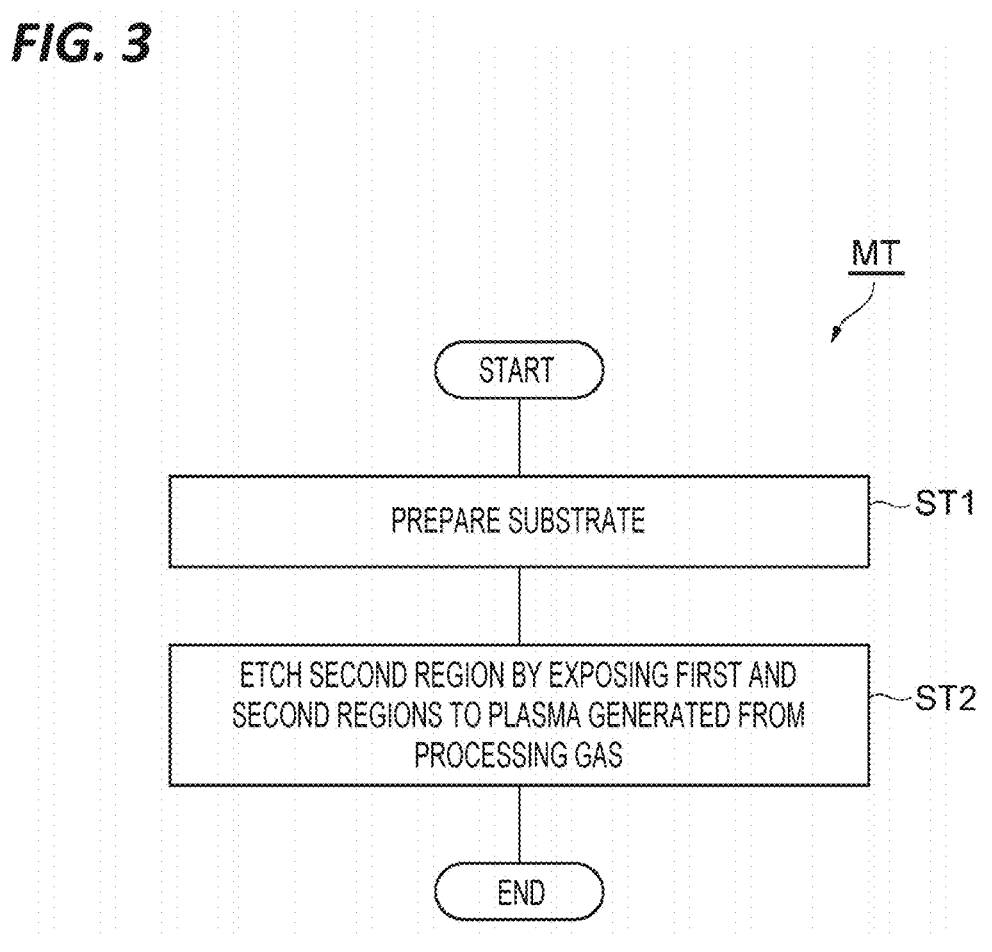

START

PREPARE SUBSTRATE — ST1

ETCH SECOND REGION BY EXPOSING FIRST AND SECOND REGIONS TO PLASMA GENERATED FROM PROCESSING GAS — ST2

END

ETCHING METHOD AND PLASMA PROCESSING APPARATUS

CROSS-REFERENCE TO RELATED APPLICATIONS

This application is based on and claims priority from Japanese Patent Application Nos. 2021-102876, 2021-171587, 2021-204527, and 2022-083897 filed on Jun. 22, 2021, Oct. 20, 2021, Dec. 16, 2021, and May 23, 2022, respectively, with the Japan Patent Office, all of which are incorporated herein in their entireties by reference.

TECHNICAL FIELD

The present disclosure relates to an etching method and a plasma processing apparatus.

BACKGROUND

Japanese Patent Laid-Open Publication No. 2016-157793 discloses a method of selectively etching a first region formed of silicon oxide with respect to a second region formed of silicon nitride, by a plasma processing on a substrate. The second region has a recess. The first region is formed to fill the recess and cover the second region. The first region is etched by plasma generated from a processing gas containing fluorocarbon.

SUMMARY

According to an aspect of the present disclosure, an etching method includes: preparing a substrate including a first region containing silicon and nitrogen, and a second region containing silicon and oxygen; and etching the second region while forming a tungsten-containing protective layer on the first region, by exposing the first and second regions to plasma generated from a processing gas containing carbon, fluorine, and tungsten.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a flowchart of an etching method according to an embodiment.

DESCRIPTION OF EMBODIMENT

Figure 1:
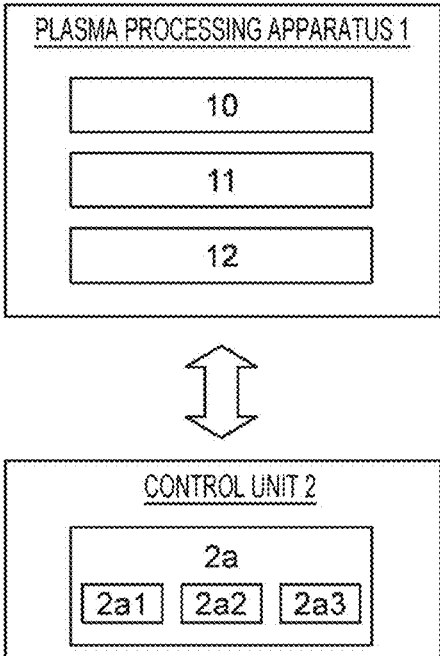
FIG. 1 is a view schematically illustrating a plasma processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

In an embodiment, an etching method includes: preparing a substrate including a first region containing silicon and nitrogen, and a second region containing silicon and oxygen; and etching the second region while forming a tungsten-containing protective layer on the first region, by exposing the first and second regions to a plasma generated from a processing gas containing carbon, fluorine, and tungsten.

According to the etching method described above, an etching selection ratio of the second region to the first region may be improved. Further, according to the etching method, the tungsten-containing protective layer is formed on the first region, so that the shoulder portion of the first region may be particularly protected. As a result, since the shoulder portion is hardly inclined, the area of the flat portion of the upper surface of the first region may be secured in a relatively large area.

In the etching step, the tungsten-containing protective layer may remain on the first region after the second region is removed.

The processing gas may include a gas containing carbon and fluorine, and a tungsten-containing gas.

The tungsten-containing gas may include tungsten hexafluoride gas.

The gas containing carbon and fluorine may include fluorocarbon gas.

The processing gas may contain oxygen. In this case, a carbon-containing film is hardly formed on the first region.

The first region may have a recess, and the second region may be embedded in the recess. In this case, the recess may be formed by etching the second region.

The etching step may be performed in a self aligned contact process.

In the etching step, a radio-frequency power and a bias power may be supplied to the plasma processing apparatus in order to generate the plasma, and the etching step may include: (a) preferentially depositing a tungsten-containing deposit on the first region by setting the radio-frequency power to a first power and setting the bias power to a second power; (b) performing a transition of setting the radio-frequency power to a third power lower than the first power and setting the bias power to the second power; and (c) etching the second region by setting the radio-frequency power to the third power and setting the bias power to a fourth power higher than the second power.

A cycle including (a) to (c) above may be repeated two or more times.

In an embodiment, an etching method includes: preparing a substrate including silicon nitride having an exposed upper surface and silicon oxide having an exposed upper surface; exposing the silicon oxide and the silicon nitride to a plasma generated from a processing gas including tungsten hexafluoride gas, thereby forming a protective layer containing tungsten nitride on the silicon nitride; and exposing the silicon oxide and the silicon nitride to the plasma generated from the processing gas including tungsten hexafluoride gas, thereby preferentially etching the silicon oxide to the silicon nitride.

The processing gas may include fluorocarbon gas.

In an embodiment, a plasma processing apparatus includes: a chamber; a substrate support configured to support a substrate in a chamber; a gas supply configured to supply a processing gas containing carbon, fluorine, and tungsten into the chamber; a plasma generator configured to generate a plasma from the processing gas in the chamber; and a controller. The controller is configured to control the gas supply and the plasma generator to perform a series of processes including: preparing a substrate including a first region containing silicon and nitrogen, and a second region containing silicon and oxygen; and etching the second region while forming a tungsten-containing protective layer on the first region, by exposing the first and second regions to a plasma generated from a processing gas containing carbon, fluorine, and tungsten.

Hereinafter, various embodiments will be described in detail with reference to the drawings. In the respective drawings, the same or corresponding components will be denoted by the same reference numerals.

Figure 2:
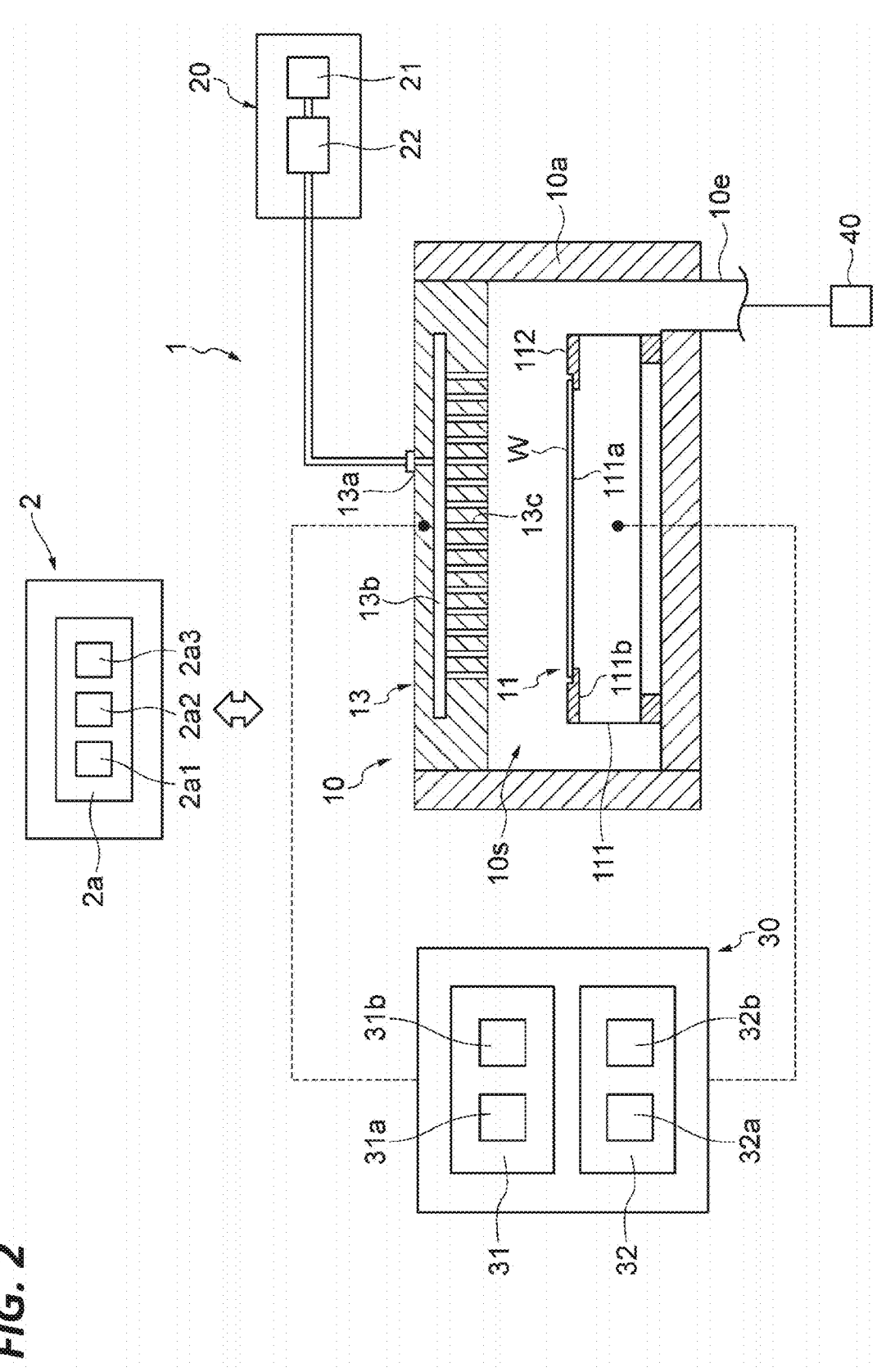
FIG. 2 is a view schematically illustrating a plasma processing apparatus according to an embodiment.

FIGS. 1 and 2 are views schematically illustrating a plasma processing apparatus according to an embodiment.

In an embodiment, a plasma processing system includes a plasma processing apparatus 1 and a control unit 2. The plasma processing apparatus 1 includes a plasma processing chamber 10, a substrate support 11, and a plasma generation unit 12. The plasma processing chamber 10 includes a plasma processing space. Further, the plasma processing chamber 10 includes at least one gas supply port for supplying at least one processing gas into the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support 11 is disposed inside the plasma processing space, and has a substrate support surface for supporting a substrate.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave plasma (HWP), or surface wave plasma (SWP). Further, various types of plasma generation units including an alternating current (AC) plasma generation unit and a direct current (DC) plasma generation unit may be used. In an embodiment, an AC signal (AC power) used in the AC plasma generation unit has a frequency in the range of 100 kHz to 10 GHz. Thus, the AC signal includes a radio frequency (RF) signal and a microwave signal. In an embodiment, the RF signal has a frequency in the range of 200 kHz to 150 MHz.

The control unit 2 processes computer-executable instructions for causing the plasma processing apparatus 1 to execute various steps described herein. The control unit 2 may be configured to control each component of the plasma processing apparatus 1 to execute the various steps described herein. In an embodiment, a part or all of the control unit 2 may be included in the plasma processing apparatus 1. The control unit 2 may include, for example, a computer 2a. The computer 2a may include, for example, a processing unit (central processing unit (CPU)) 2a1, a storage unit 2a2, and a communication interface 2a3. The processing unit 2a1 may be configured to perform various control operations based on programs stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as, for example, a local area network (LAN).

Hereinafter, an example of the configuration of the plasma processing system will be described.

The plasma processing system includes the capacitively coupled plasma processing apparatus 1 and the control unit 2. The capacitively coupled plasma processing apparatus 1 includes the plasma processing chamber 10, the gas supply unit 20, a power supply 30, and an exhaust system 40. Further, the plasma processing apparatus 1 includes the substrate support 11 and a gas introduction unit. The gas introduction unit is configured to introduce at least one processing gas into the plasma processing chamber 10, The gas introduction unit includes a shower head 13, The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support 11. The plasma processing chamber 10 includes at least one gas supply port for supplying at least one processing gas into the plasma processing space 10s, and at least one gas discharge port for discharging a gas from the plasma processing space 10s. The side wall 10a, is grounded. The shower head 13 and the substrate support 11 are electrically insulated from the housing of the plasma processing chamber 10.

The substrate support 11 includes a main body 111 and a ring assembly 112. The main body 111 has a central region (substrate support surface) 111a for supporting a substrate (wafer) W, and an annular region (ring support surface) 111b for supporting the ring assembly 112. The annular region 111b of the main body 111 surrounds the central region ilia of the main body 111 in a plan view. The substrate W is placed on the central region 111a of the main body 111, and the ring assembly 112 is disposed on the annular region 111b of the main body 111 to surround the substrate W placed on the central region 111a of the main body 111. In an embodiment, the main body 111 includes a base and an electrostatic chuck. The base includes a conductive member. The conductive member of the base functions as an electrode. The electrostatic chuck is disposed on the base. The upper surface of the electrostatic chuck serves as the substrate support surface 111a. The ring assembly 112 includes one or more annular members. At least one of the one or more annular members is an edge ring. Although not illustrated, the substrate support 11 may include a temperature adjustment module configured to adjust at least one of the electrostatic chuck, the ring assembly 112, and the substrate to a target temperature. The temperature adjustment module may include a heater, a heat transfer medium a flow path, or a combination thereof. A heat transfer fluid such as brine or a gas flows through the flow path. The substrate support 11 may include a heat transfer gas supply unit configured to supply a heat transfer gas to the space between the back surface of the substrate W and the substrate support surface 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b, and is introduced into the plasma processing space 10s from the plurality of gas introduction ports 13c. The shower head 13 further includes a conductive member. The conductive member of the shower head 13 faces the substrate support 11, and functions as an electrode (may also be referred to as a counter electrode). The gas introduction unit may include one or a plurality of side gas injectors (SGI) attached to one or a plurality of openings formed in the side wall 10a, in addition to the shower head 13.

The gas supply unit 20 may include at least one gas source 21 and at least one flow rate control device 22. In an embodiment, the gas supply unit 20 is configured to supply at least one processing gas from the corresponding gas source 21 to the shower head 13 via the corresponding flow rate control device 22. Each flow rate control device 22 may include, for example, a mass flow controller or a pressure-controlled flow rate control device. The gas supply unit 20 may further include one or more flow rate modulation devices that modulate or pulse the flow rate of at least one processing gas.

The power supply 30 includes an RE power supply 31 coupled to the plasma processing chamber 10 via at least one impedance matching circuit. The RE power supply 31 is configured to supply at least one RF signal (RF power), such as a source RF signal or a bias RF signal, to a conductive member of the substrate support 11 and/or the conductive member of the shower head 13. As a result, plasma is formed from at least one processing gas supplied into the plasma processing space 10s. Thus, the RF power supply 31 may function as at least a portion of a plasma generation unit configured to generate plasma from one or more processing gases in the plasma processing chamber 10. Further, by supplying the bias RF signal to the conductive member of the substrate support 11, a bias electric potential is generated in the substrate W, so that ion components in the formed plasma may be drawn into the substrate W.

In an embodiment, the RF power supply 31 includes a first RF generation unit 31a and a second RF generation unit 31b. The first RF generation unit 31a is coupled to the conductive member of the substrate support 11 and/or the conductive member of the shower head 13 via at least one impedance matching circuit, and configured to generate a source RF signal (source RF power) for generating plasma, in an embodiment, the source RF signal has a frequency in the range of 13 MHz to 150 MHz. In an embodiment, the first RF generation unit 31a may be configured to generate multiple source RF signals having different frequencies. The generated one or more source RF signals are supplied to the conductive member of the substrate support 11 and/or the conductive member of the shower head 13. The second RF generation unit 31b is coupled to the conductive member of the substrate support 11 via at least one impedance matching circuit, and configured to generate a bias RF signal (bias RF power), in an embodiment, the bias RF signal has a frequency lower than that of the source RF signal. In an embodiment, the bias RF signal has a frequency in the range of 400 kHz to 13.56 MHz. In an embodiment, the second RF generation unit 31b may be configured to generate multiple bias RF signals having different frequencies. The generated one or more bias RF signals are supplied to the conductive member of the substrate support 11. In various embodiments, at least one of the source RF signal and the bias RF signal may be pulsed.

The power supply 30 may further include a direct current (DC) power supply 32 coupled to the plasma processing chamber 10. The DC power supply 32 includes a first DC generation unit 32a and a second DC generation unit 32b. In an embodiment, the first DC generation unit 32a is connected to the conductive member of the substrate support 11, and configured to generate a first DC signal. The generated first DC signal is applied to the conductive member of the substrate support 11. In an embodiment, the first DC signal may be applied to another electrode such as the electrode of the electrostatic chuck. In an embodiment, the second DC generation unit 32b is connected to the conductive member of the shower head 13, and configured to generate a second DC signal. The generated second DC signal is applied to the conductive member of the shower head 13. In various embodiments, at least one of the first and second DC signals may be pulsed. The first and second DC generation units 32a and 32b may be provided in addition to the RF power supply 31, or the first DC generation unit 32a may be provided in place of the second RF generation unit 31b.

The exhaust system 40 may be connected to a gas discharge port 10e provided in, for example, the bottom of the plasma processing chamber 10. The exhaust system 40 may include a pressure regulating valve and a vacuum pump. The pressure regulating valve regulates the pressure in the plasma processing space 10s. The vacuum pump may include a turbo molecular pump, a dry pump, or a combination thereof.

FIG. 3 is a flowchart of an etching method according to an embodiment. An etching method MT (hereinafter, referred to as a "method MT") illustrated in FIG. 3 may be performed by the plasma processing apparatus 1 of the embodiment described above. The method MT may be applied to the substrate W.

Figure 4:
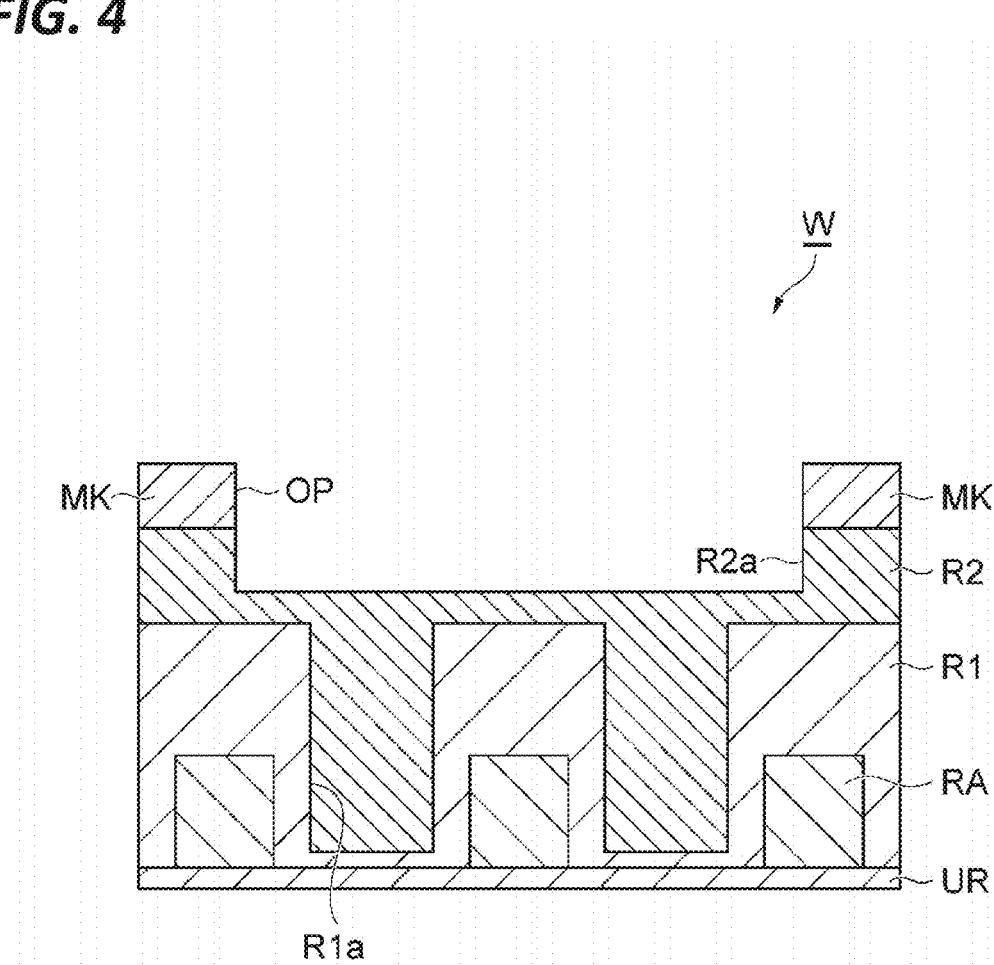
FIG. 4 is a partially enlarged cross-sectional view of a substrate in an example to which the method of FIG. 3 may be applied.

FIG. 4 is a partially enlarged cross-sectional view of a substrate in an example to which the method of FIG. 3 may be applied. As illustrated in FIG. 4, in an embodiment, the substrate W includes a first region R1 and a second region R2. The first region R1 may have at least one recess R1a. The first region R1 may have a plurality of recesses R1a. Each recess R1a may be a recess for forming a contact hole. The second region R2 may be embedded in the recess R1a. The second region R2 may be formed to cover the first region R1.

The first region R1 contains silicon. The first region R1 may contain at least one of nitrogen and carbon. The first region R1 may contain silicon nitride (SiN$_x$). The first region R1 may contain silicon carbide (SiC). The first region R1 may contain silicon carbonitride (SiCN). The first region R1 may be formed by, for example, a CVD, or may be obtained by nitriding or carbonizing silicon. The first region R1 may include a first portion containing silicon nitride ($SiN_x$) and a second portion containing silicon carbide (SiC). In this case, the first portion has the recess R1$a$.

The second region R2 contains silicon and oxygen. The second region R2 may include silicon oxide ($SiO_x$). The second region R2 may be formed by, for example, a CND, or may be obtained by oxidizing silicon. The second region R2 may have a recess R2$a$. The recess R2$a$ has a width larger than the width of the recess R1$a$.

The substrate W may include an underlying region UR and at least one raised region RA formed on the underlying region UR. The underlying region UR and at least one raised area RA are covered by the first region R1. The underlying region UR may contain silicon. A plurality of raised areas RA is positioned on the underlying region UR. The recess R1$a$ of the first region R1 is positioned between the plurality of raised areas RA, Each raised area. RA may form a gate area of a transistor.

The substrate W may include a mask MK. The mask MK is provided on the second region R2. The mask MK may contain metal or silicon. The mask MK may have an opening OP. The opening OP corresponds to the recess R2$a$ of the second region R2.

Figure 5:
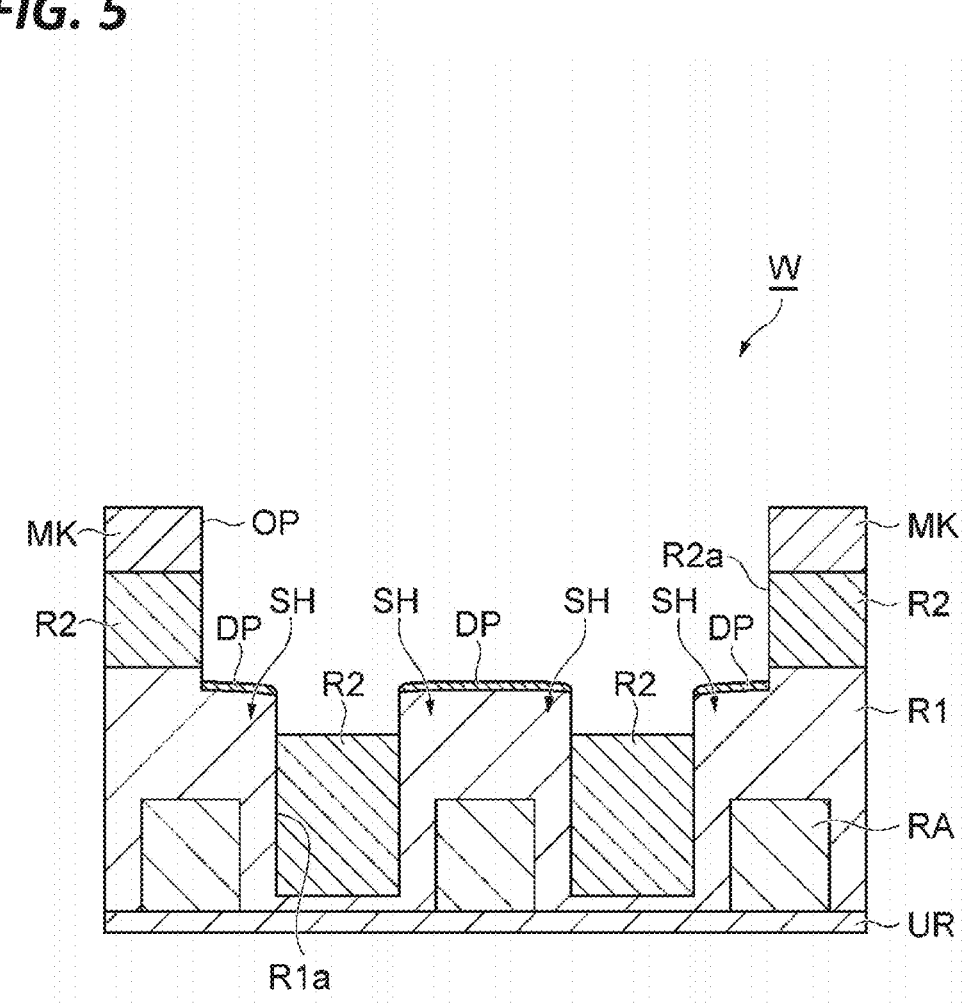
FIG. 5 is a cross-sectional view illustrating a step of an etching method according to an embodiment.
Figure 6:
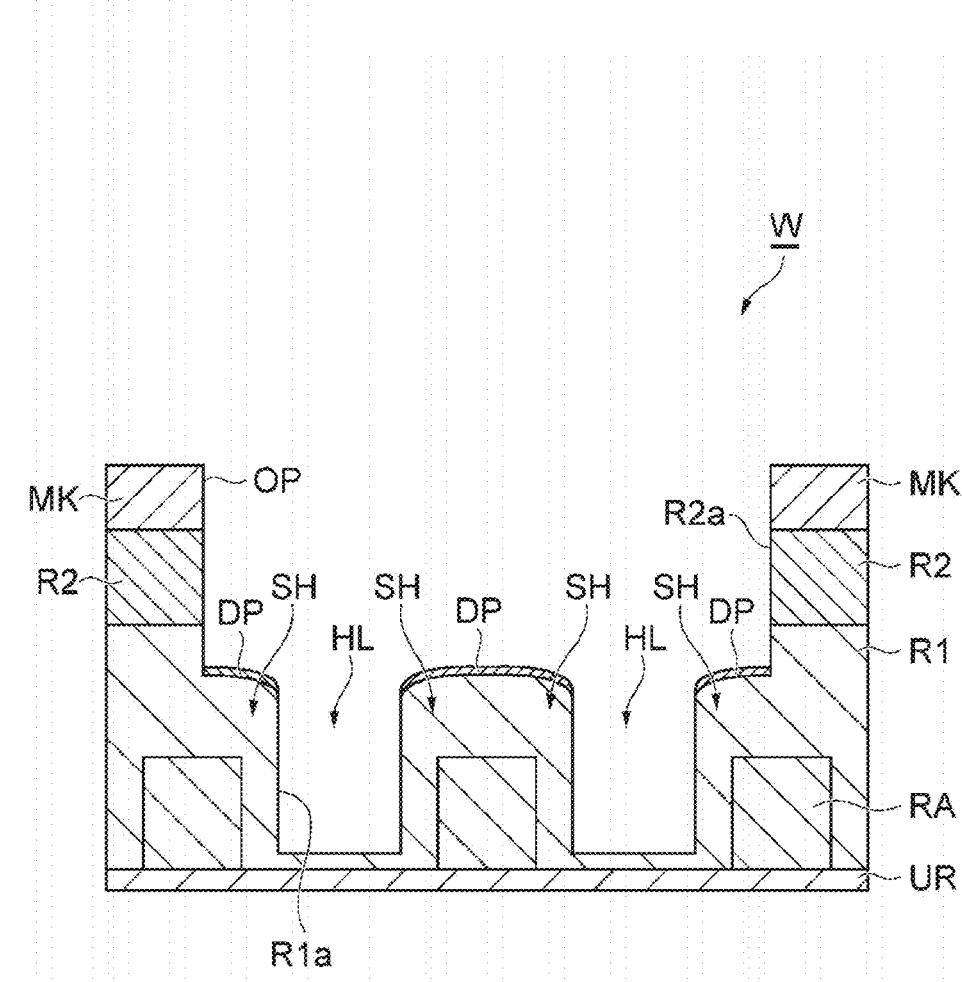
FIG. 6 is a partially enlarged cross-sectional view of a substrate in an example obtained by performing an etching method according to an embodiment.

Hereinafter, the method MT will be described with reference to FIGS. 3 to 6, assuming a case where the method MT is applied to the substrate W by using the plasma processing apparatus 1 of the embodiment described above. FIG. 5 is a cross-sectional view illustrating one step of the etching method according to the embodiment. FIG. 6 is a partially enlarged cross-sectional view of a substrate in an example obtained by performing the etching method according to the embodiment. When the plasma processing apparatus 1 is used, the method MT may be performed in the plasma processing apparatus 1 in the manner that the control unit 2 controls each component of the plasma processing apparatus 1. In the method MT, as illustrated in FIG. 2, the substrate W on the substrate support 11 disposed in the plasma processing chamber 10 is processed.

As illustrated in FIG. 3, the method MT includes steps ST1 and ST2. The steps ST1 and ST2 may be sequentially performed.

In the step ST1, the substrate W illustrated in FIG. 4 is prepared. The substrate W may be supported by the substrate support 11 in the plasma processing chamber 10. The substrate W may have the shape illustrated in FIG. 4 as a result of a plasma etching, or may have the shape illustrated in FIG. 4 from the time when the substrate W is provided into the plasma processing chamber 10. In the step ST1, the upper surface of the first region R1 and the upper surface of the second region R2 may be exposed. That is, in the step ST1, the upper surface of the silicon nitride and the upper surface of the silicon oxide may be exposed.

In the step ST2, as illustrated in FIG. 5, the second region R2 is etched by exposing the first region R1 and the second region R2 to plasma generated from a processing gas containing carbon, fluorine, and tungsten. The mask MK is used for the etching. The etching may be performed as follows. First, the gas supply unit 20 supplies the processing gas containing carbon, fluorine, and tungsten into the plasma processing chamber 10. Next, the plasma generation unit 12 generates plasma from the processing gas in the plasma processing chamber 10. The control unit 2 controls the gas supply unit 20 and the plasma generation unit 12 such that the first region R1 and the second region R2 are exposed to the plasma, and thus, the second region R2 is etched while forming the tungsten-containing protective layer on the first region R1.

The processing gas may include a gas containing carbon and fluorine, and a tungsten-containing gas. The gas containing carbon and fluorine may include at least one of fluorocarbon gas and hydrofluorocarbon gas. The fluorocarbon ($C_xF_y$) gas may include at least one of $CF_4$ gas, $C_3F_8$ gas, $C_4F_8$ gas, and $C_4F_6$ gas. Instead of an oxygen-containing gas (e.g., $O_2$ gas) which is a gas for controlling a deposition of carbon, $C_xF_y$), gas containing a relatively large amount of F, for example, $C_4F_8$ gas may be used. Instead of a mixed gas of $C_4F_6$ gas and the oxygen-containing gas, for example, a mixed gas of $C_4F_6$ gas and $C_4F_8$ gas may be used. Hydrofluorocarbon ($C_xH_yF_z$) gas may include at least one of $CH_2F_2$ gas. $CHF_3$ gas, and $CH_3F$ gas.

The tungsten-containing gas may include halogenated tungsten gas. The halogenated tungsten gas may include at least one of tungsten hexafluoride ($WF_6$) gas, tungsten hexabromide ($WBr_6$) gas, tungsten hexachloride ($WCl_6$) gas, and $WF_5Cl$ gas. The tungsten-containing gas may include hexacarbonyl tungsten ($W(CO)_6$) gas.

The processing gas may or may not contain oxygen. The processing gas may include an oxygen-containing gas. The oxygen-containing gas may include at least one of $O_2$ gas, CO gas, and $CO_2$ gas. The processing gas may include a noble gas such as, for example, argon.

In the step ST2, the temperature of the substrate support 11 may be 100° C. or higher, 120° C. or higher, 130° C. or higher, a temperature exceeding 130° C., 140° C. or higher, or 150° C. or higher. The temperature of the substrate support 11 may be 250° C. or lower.

In the step ST2, the pressure in the plasma processing chamber 10 may be 1 mTorr (0.13 Pa) or more, or 10 mTorr (1.3 Pa) or more. The pressure in the plasma processing chamber 10 may be 50 mTorr (6.7 Pa) or less, or 30 mTorr (4.0 Pa) or less.

In the step ST2, as illustrated in FIG. 5, a tungsten-containing film DP (tungsten-containing protective layer) may be formed on the first region R1. The tungsten-containing film DP may protect, in particular, a shoulder portion SH in the recess R1$a$ of the first region R1. As a result, the shoulder portion SH is hardly inclined, so that the flat portion of the upper surface of the first region R1 may have the relatively large area. The tungsten-containing film DP may contain nitrogen. The tungsten-containing film DP may contain tungsten nitride ($WN_x$). A carbon-containing film may be formed on the tungsten-containing film DP. The carbon-containing film may contain fluorine. The tungsten-containing film DP and the carbon-containing film suppress the etching of the first region R1. The second region R2 is not covered by the tungsten-containing film DP, and thus, is etched. By etching the second region R2, a contact hole HL is formed as illustrated in FIG. 6. The contact hole HL corresponds to the recess R1$a$ of the first region R1. The step ST2 may be performed in a self-aligned contact (SAC) process. After the second region R2 in the recess R1$a$ is removed, the tungsten-containing film DP remains on the first region R1. The tungsten-containing film DP may be removed through a cleaning after the step ST2.

According to the method MT described above, the etching selection ratio of the second region R2 to the first region R1 may be improved. For example, the selection ratio of the second region R2 containing silicon oxide ($SiO_x$) to the first region R1 containing silicon nitride ($SiN_x$) may be 5 or more. Although not bound by a theory, the reason may be considered as follows. The second region R2 containing silicon oxide is etched by active species containing fluorine in the plasma. For example, when $WF_x$ reacts with $SiO_x$, $WO_x$ or $WO_xF_y$ is produced. As a result, $SiO_x$ is etched.

Meanwhile, the active species containing tungsten in the plasma reacts with the silicon nitride of the first region R1, and tungsten nitride is deposited on the upper surface of the first region R1. Alternatively, the active species containing tungsten in the plasma reacts with the silicon nitride of the first region R1, so that at least a portion of the upper surface of the first region R1 is modified, and the modified portion contains the tungsten nitride. For example, when NW, reacts with $SiN_x$, $WN_x$ and $SiF_x$ are produced. $WN_x$, may be contained in the deposited layer of the upper surface of the first region R1, or may be contained in the layer obtained by modifying the upper surface of the first region R1. As a result, the tungsten-containing film DP containing tungsten nitride is formed on the first region R1. The tungsten-containing film DP is preferentially deposited on the portion where the active species containing tungsten in the plasma is incident with relatively high energy, that is, on the upper surface of the first region R1, or the silicon nitride of the upper surface of the first region R1 is modified. The tungsten-containing film DP suppresses the etching of the first region R1. As a result, the etching selection ratio of the second region R2 to the first region R1 is improved.

Further, according to the method MT described above, since the tungsten-containing film. DP functions as an etching mask, it is unnecessary to form a thick carbon-containing film on the tungsten-containing film DP. The thick carbon-containing film may cause a clogging of a contact hole. Thus, in the method MT described above, the clogging of the contact hole HL by the carbon-containing film is suppressed.

When the processing gas contains oxygen, the carbon-containing film is hardly formed on the first region R1. Thus, the clogging of the contact hole HL by the carbon-containing film is suppressed. Meanwhile, when the processing gas contains oxygen, silicon oxide is formed on the surface of the first region R1 due to the oxidation of the surface of the first region R1, As a result, the surface of the first region R1 is etched. When the processing gas contains no oxygen, the etching of the first region R1 is suppressed. As a result, the etching selection ratio of the second region R2 to the first region R1 is further improved.

Figure 7:
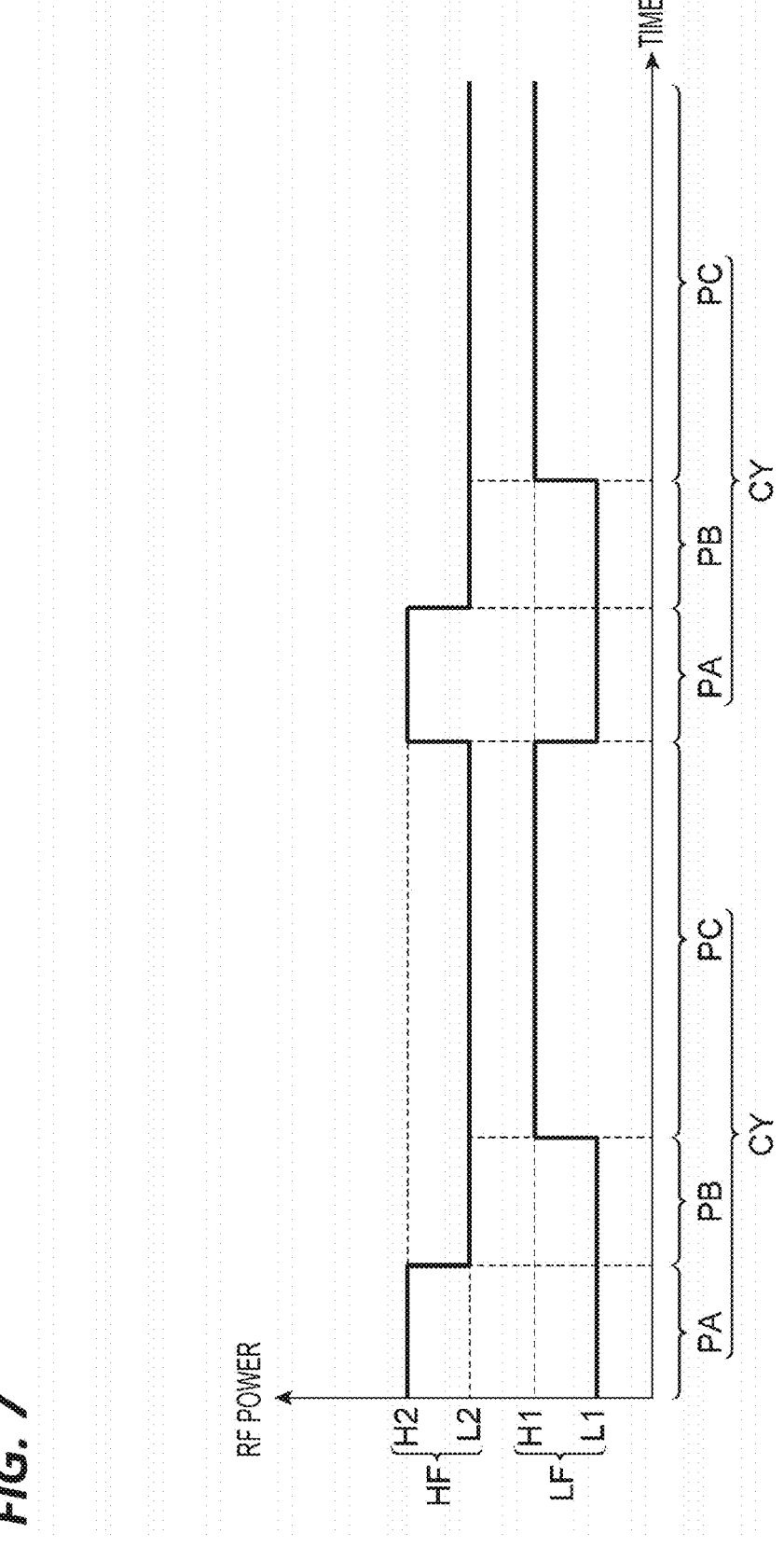
FIG. 7 is an example of a timing chart illustrating temporal changes of an RF power applied to an electrode in a main body and an RF power applied to a counter electrode.

FIG. 7 is an example of a timing chart illustrating temporal changes of the bias power applied to the electrode in the main body 111 of the substrate support 11 and the RF power applied to the counter electrode. The timing chart relates to the step ST2 of the method MT. In the step ST2, the bias power may be applied to the electrode in the main body 111. The bias power may be, for example, an RF power LF. The following descriptions relate to an example of a power used for a substrate having a diameter of 300 mm. The RF power LF may be 10 W or more and 300 W or less, 30 W or more and 200 W or less, or 50 W or more and 100 W or less. The frequency of the RF power LF may be 100 kHz or more and 40.68 MHz or less. When the RF power LF is relatively small, the etching of the first region R1 by the ions in the plasma is suppressed. In the step ST2, an RF power HF may be applied to the counter electrode. The RF power HF may be 50 W or more and 1,000 W or less, 80 W or more and 800 W or less, or 100 W or more and 500 W or less. The frequency of the RF power HF may be 27 MHz or more and 100 MHz or less. The RF power LF and the RF power HF may be periodically applied in a cycle CY. The bias power may be supplied to the conductive member of the substrate support 11. The RF power HF may be supplied to an antenna including one or more coils.

The ion energy of the plasma may be 50 eV or more and 700 eV or less, 100 eV or more and 600 eV or less, or 120 eV or more and 500 eV or less. When the ion energy is high, the thickness of the tungsten-containing film DP may be made relatively thick. The ion energy in the present disclosure may be average ion energy incident on the upper surface of the substrate, or may be expressed as a distribution of ion energy incident on the upper surface of the substrate.

The cycle CY may include a first period PA, a second period PB, and a third period PC. In the first period PA, the RF power LF is maintained at a low power L1 (second power; e.g., less than 100 W), and the RF power HF is maintained at a high power H2 (first power; e.g., more than 100 W). In the first period PA, the deposition of the tungsten-containing film DP and the carbon-containing film is accelerated. In the second period PB, the RF power LF is maintained at the low power L1, and the RF power HF is maintained at a low power L2 (third power; e.g., less than 200 W). The low power L2 is smaller than the high power H2, and larger than the low power L1. In the third period PC, the RF power LF is maintained at a high power H1 (fourth power; e.g., more than 50 W), and the RF power HF is maintained at the low power L2. The high power H1 is larger than the low power L1 and smaller than the high power H2. In the third period PC, the etching of the second region R2 is accelerated. The second period PB is a transition period in which the first period PA transitions to the third period PC. In the step ST2, one cycle corresponding to the cycle CY including the first period PA, the second period PB, and the third period PC may be repeated two or more times.

The proportion of the first period PA in the cycle CY is smaller than the proportion of the third period PC in the cycle CY. The proportion of the first period PA in the cycle CY may be 10% or more, or may be less than 50%. When the proportion of the first period PA is relatively large, the etching selection ratio of the second region R2 to the first region R1 increases. When the proportion of the first period PA is relatively small, the clogging of the contact hole HL is suppressed. The proportion of the third period PC in the cycle CY may be 50% or more. When the proportion of the third period PC is relatively large, the etching selection ratio of the second region R2 to the first region R1 increases. The frequency that defines the cycle CY may be 1 kHz or more and 1 MHz or less. The time length of the cycle CY is the reciprocal of the frequency that defines the cycle CY.

Figure 8:
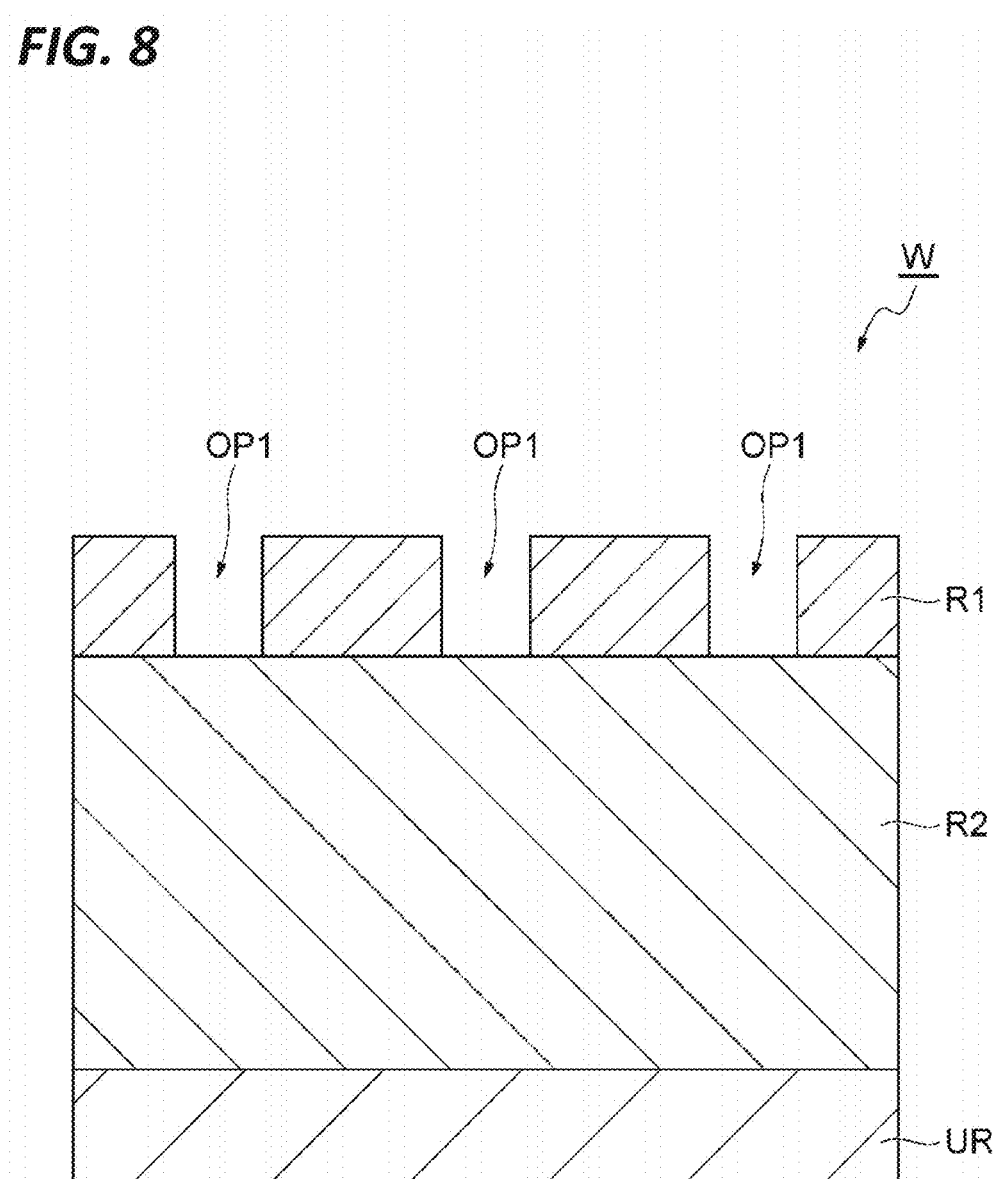
FIG. 8 is a partially enlarged cross-sectional view of a substrate in an example to which the method of FIG. 3 may be applied.

FIG. 8 is a partially enlarged cross-sectional view of a substrate in an example to which the method of FIG. 3 may be applied. As illustrated in FIG. 8, in an embodiment, the substrate W includes the first region R1 and the second region R2. The substrate W may include the underlying region UR. The first region R1 may be formed on the second region R2. The second region R2 may be formed on the underlying region UR. Each of the first region R1, the second region R2, and the underlying region UR may be a film. The first region R1 may function as a mask. The first region R1 may have at least one opening OP1. The first region R1 may have a plurality of openings OP1. Each opening OP1 may be an opening for forming a contact hole. The dimension of the opening OP1 may be 200 nm or less. The dimension of the opening OP1 may be 15 nm or more. The first region R1 contains silicon and nitrogen. The first region R1 may not contain nitrogen. The second region R2 contains silicon and oxygen. The underlying region UR may contain silicon and nitrogen. The underlying region UR may contain silicon nitride ($SiN_x$).

Figure 9:
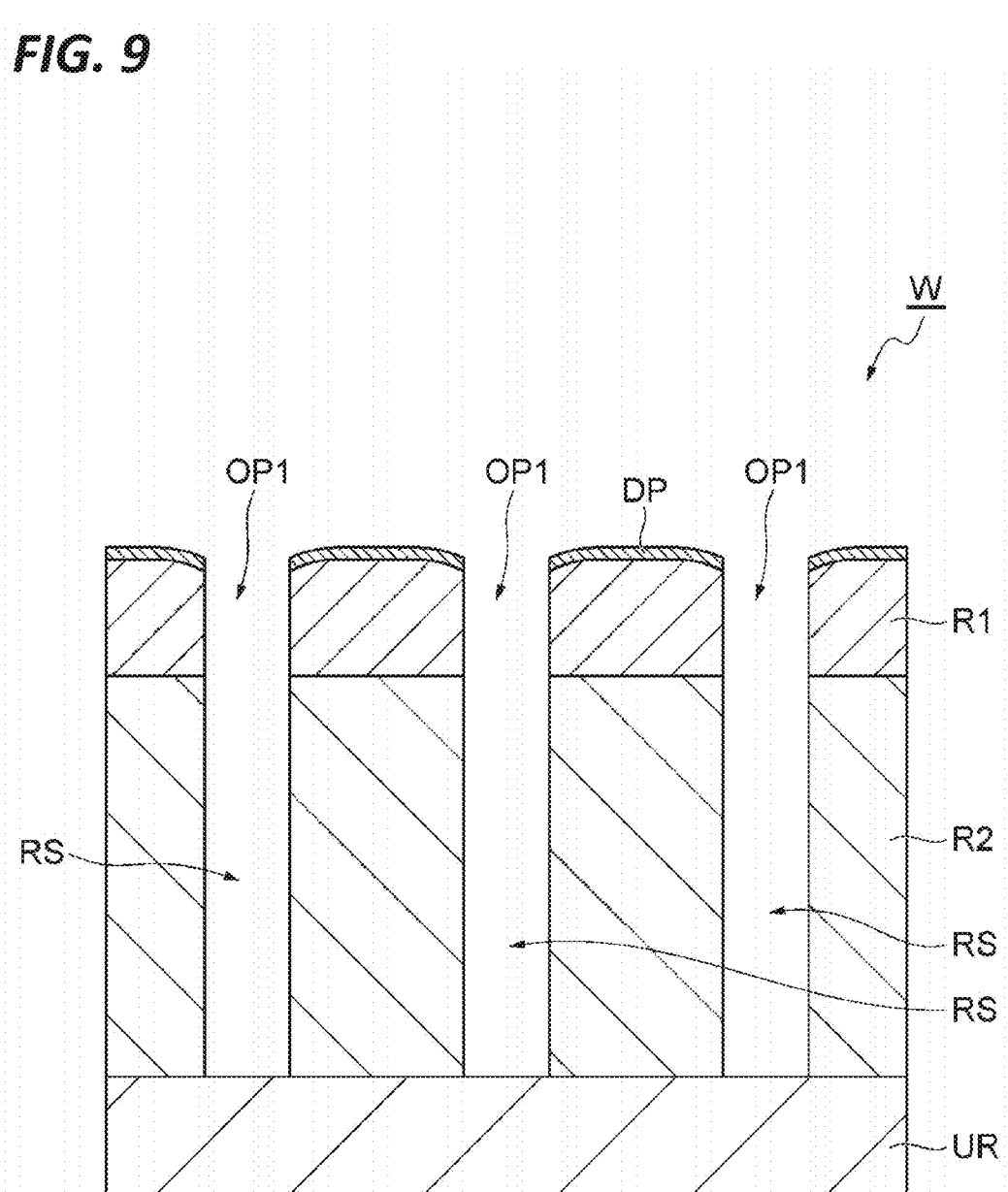
FIG. 9 is a partially enlarged cross-sectional view of a substrate in an example obtained by performing an etching method according to an embodiment.

FIG. 9 is a partially enlarged cross-sectional view of a substrate in an example obtained by performing an etching method according to an embodiment. When the method MT is applied to the substrate W of FIG. 8, a recess RS corresponding to the opening OP1 is formed in the second region R2, as illustrated in FIG. 9. The recess RS may be a contact hole. The bottom of the recess RS may reach the underlying region UR. In the step ST2, as illustrated in FIG. 9, the tungsten-containing film DP may be formed on the first region R1.

According to the method MT described above, the etching selection ratio of the second region R2 to the first region R1 may be improved. In the step ST2, since the flow rate of the gas containing carbon and fluorine may be reduced, the deposition of the carbon-containing film on the side wall of the recess RS may be suppressed. Thus, the side wall of the recess RS may be made close to a vertical shape. Further, since the etching rate in the step ST2 may be increased, the etching time may be reduced to, for example, about the half.

Figure 10:
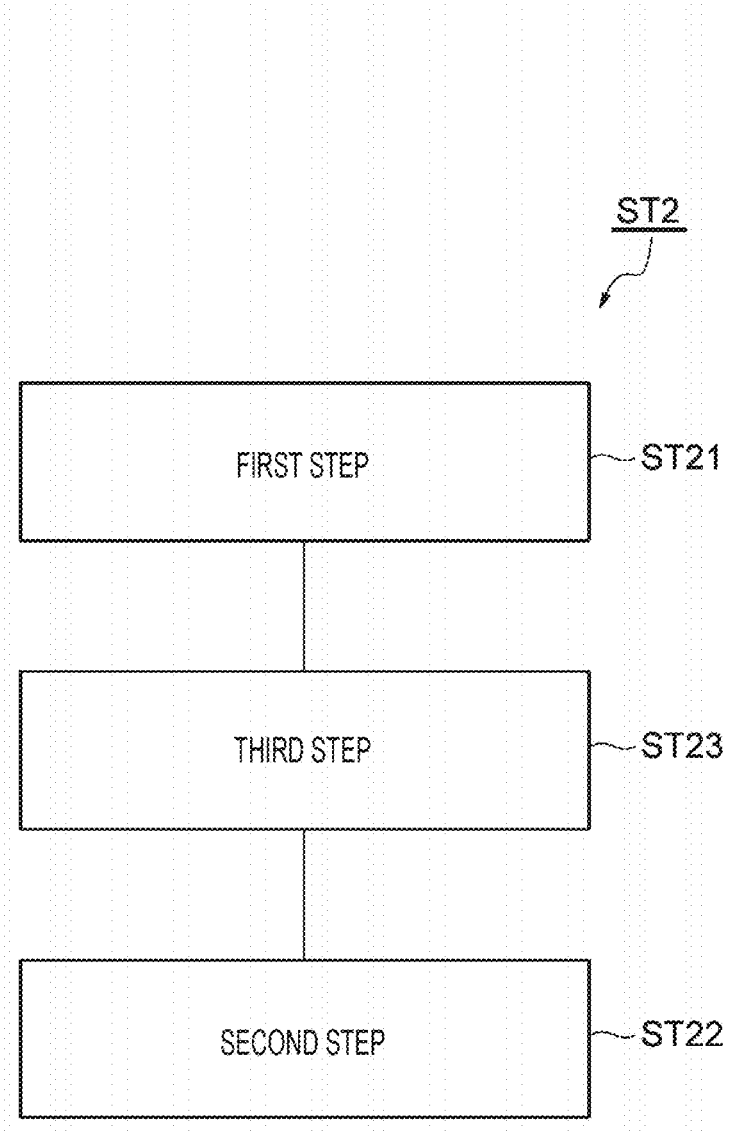
FIG. 10 is a view illustrating an example of an etching step.

FIG. 10 is a view illustrating an example of an etching step. In the method MT, the etching step ST2 may include a first step ST21 and a second step ST22. The first step ST21 and the second step ST22 may be sequentially performed. The etching step ST2 may further include a third step S123 between the first step ST21 and the second step ST22.

According to an embodiment, in the first step ST21, the tungsten-containing film DP (first tungsten-containing deposit) may be formed on the first region R1, by supplying a bias power (fifth power) to the plasma processing apparatus 1 (see FIG. 5). The thickness of the tungsten-containing film DP may be 2 nm or more and 5 nm or less. The bias power may be the RF power LF applied to the electrode in the main body 111 of the substrate support 11. In the following descriptions, an example of a power used for a substrate with a diameter of 300 mm will be described. The RF power LF may be 50 W or more or 300 W or more. When the RF power LF is increased, the ion energy of plasma increases, so that the thickness of the tungsten-containing film DP may be increased. The RF power LF may be 500 W or less or 800 W or less. When the RF power LF is decreased, the decrease amount (etching amount) of the first region R1 may be reduced. In the first step ST21, the RF power HF applied to the counter electrode may not be supplied to the plasma processing apparatus 1. The other process conditions (e.g., a type of processing gas, a flow rate ratio of each gas, a process time, a temperature, and a pressure) in the first step ST21 may be the same as the process conditions in the step ST2 described above. The processing gas in the first step ST21 may contain oxygen, carbon, fluorine, and tungsten. The second region R2 may be etched in the first step ST21.

In the third step ST23, the tungsten-containing film DP may be exposed to plasma generated from a processing gas including a hydrogen-containing gas (hydrogen plasma processing). The processing gas including the hydrogen-containing gas may be different from the processing gas of the first step ST21. The hydrogen-containing gas may include at least one of H$_2$ gas, SiH$_4$ gas, and CH$_4$ gas. The processing gas in the third step ST23 may further include a noble gas such as argon. The time of the third step ST23 may be 5 seconds or more and 15 seconds or less. When the time of the third step ST23 is increased, the decrease amount of the first region R1 by hydrogen radicals increases.

In the second step ST22, the second region R2 may be etched while forming an additional tungsten-containing film DP (second tungsten-containing deposit) on the already formed tungsten-containing film DP, by supplying a radio-frequency power and a bias power to the plasma processing apparatus 1. The radio-frequency power may be the RF power HF applied to the counter electrode. The bias power (sixth power) in the second step ST22 may be lower than the bias power (fifth power) in the first step ST21. When the bias power changes in each step, the bias power in each step may be an average value of the changing bias powers. The process conditions in the second step ST22 may be the same as the process conditions in the step ST2 described above. The processing gas in the second step ST22 may contain oxygen, carbon, fluorine, and tungsten.

According to another embodiment, in the first step ST21, the tungsten-containing film DP (first tungsten-containing deposit) may be formed on the first region R1, by using a processing gas including a hydrogen-containing gas. Examples of the hydrogen-containing gas may be the same as the examples of the hydrogen-containing gas in the third step ST23. Examples of the gas included in the processing gas may be the same as the examples of the gas included in the processing gas of the step ST2 described above. The other process conditions (e.g., a flow rate ratio of each gas, a process time, a temperature, a pressure, and a power to be applied) in the first step ST21 may be the same as the process conditions in the step ST2 described above. The processing gas in the first step ST21 may contain hydrogen, carbon, fluorine, and tungsten. The second region R2 may be etched in the first step ST21.

In the second step ST22, the second region R2 may be etched while forming an additional tungsten-containing film DP (second tungsten-containing deposit), by using a processing gas including an oxygen-containing gas. The process conditions (e.g., a type of processing gas, a flow rate ratio of each gas, a process time, a temperature, a pressure, and a power to be applied) in the second step ST22 may be the same as the process conditions in the step ST2 described above. The processing gas in the second step ST22 may contain oxygen, carbon, fluorine, and tungsten.

Generally, in an opening with a relatively small dimension, active species containing tungsten is hardly transported into the opening, and thus, the thickness of the tungsten-containing film may be reduced. According to the method MT including the first step ST21, the tungsten-containing film DP having a high film thickness uniformity may be formed, regardless of the dimension of the opening OP of the mask MK (the width of the recess R2a). Thus, the etching selection ratio of the second region R2 with respect to the first region R1 may be improved in both the opening OP having a relatively large dimension and the opening OP having a relatively small dimension. Further, according to the method MT including the first step ST21, the thickness of the tungsten-containing film DP may be increased. When the processing gas in the first step ST21 includes a hydrogen-containing gas, the thickness of the tungsten-containing film DP may be increased without increasing the RF power LF in the first step ST21. This is believed to be because tungsten reduced by the hydrogen-containing gas is deposited by CVD.

When the third step ST23 is performed or when the processing gas in the first step ST21 includes a hydrogen-containing gas, the composition ratio of tungsten in the tungsten-containing film DP may be increased. This is believed to be because tungsten oxide is reduced by hydrogen so that metallic tungsten is produced.

After the first step ST21, the second region R2 may be etched by using a processing gas that does not include a tungsten-containing gas, without performing the second step ST22.

While various embodiments have been described, various additions, omissions, substitutions, and modifications may be made without being limited to the embodiments. Further, the elements in the different embodiments may be combined with each other to form another embodiment.

For example, the target to which the step ST2 of the method MT is applied is not limited to the self-aligned contact (SAC) process. The step ST2 may be applied to another step which requires a high etching selection ratio.

For example, a molybdenum-containing gas may be used, instead of or in addition to the tungsten-containing gas. The molybdenum-containing gas may include a halogenated molybdenum gas. The halogenated molybdenum gas may contain at least one of molybdenum hexafluoride (MoF$_6$) gas and molybdenum hexachloride (MoCl$_6$) gas.

Hereinafter, various experiments conducted for evaluating the method MT will be described. The experiments described below do not limit the present disclosure.

(First Experiment)

In a first experiment, the substrate W including the first region R1 containing silicon nitride (SiN$_x$) and the second region R2 containing silicon oxide (SiO$_x$) was prepared. Then, step ST2 was performed on the substrate W by using the plasma processing apparatus 1. In step ST2 the processing gas was a mixed gas of fluorocarbon gas, oxygen gas, and tungsten hexafluoride gas (WF$_6$). The flow rate ratio of the tungsten hexafluoride gas (WF$_6$) is higher than the flow rate ratio of the fluorocarbon gas, and higher than the flow rate ratio of the oxygen gas.

(Second Experiment)

In a second experiment, the same method as that of the first experiment was executed, except that in step ST2, tungsten hexafluoride gas (WF$_6$) is removed from the processing gas.

(Experimental Result)

Figures 11A, 11B:
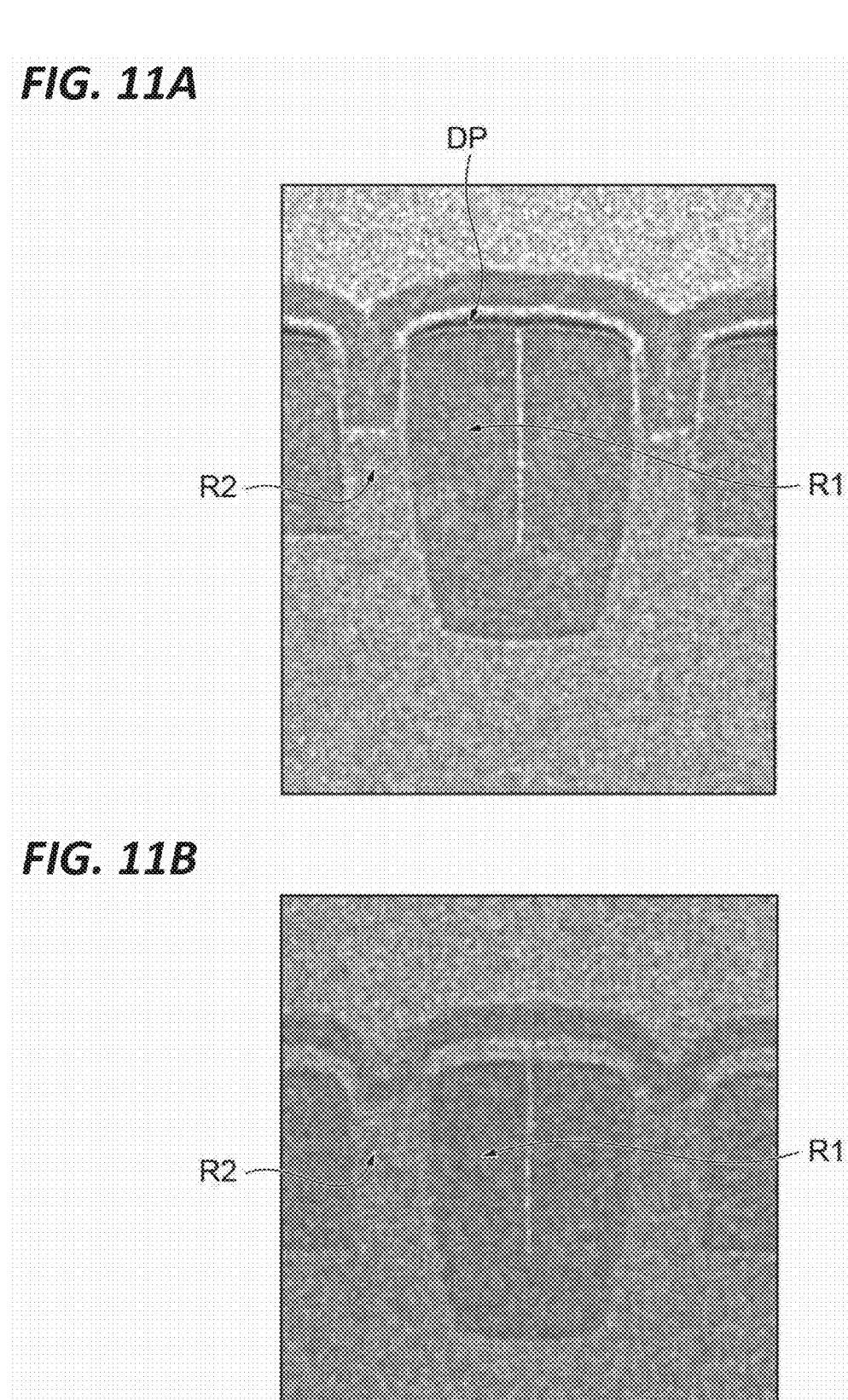
FIGS. 11A and 11B are views illustrating cross-sectional TEM images of a substrate obtained by performing an etching method in first and second experiments.

Cross-sectional TEM images of the substrate W obtained by executing the methods in the first and second experiments were observed. FIG. 11A is a view illustrating a cross-sectional TEM image of the substrate obtained by performing the etching method in the first experiment. FIG. 11B is a view illustrating a cross-sectional TEM image of the substrate obtained by performing the etching method in the second experiment. In FIG. 11A, the film DP formed on the first region R1 (the black portion in FIG. 11A) is confirmed. From the result of the TEM-EDX, it is confirmed that the portion corresponding to the film DP in FIG. 11A contains tungsten. Meanwhile, in FIG. 11B, no tungsten-containing film is confirmed on the first region R1. In FIG. 11A, the bottom of the recess formed by the etching (the upper surface of the second region R2) is flat. Meanwhile, in FIG. 11B, the bottom of the recess formed by the etching (the upper surface of the second region R2) is inclined. Thus, it is understood from the first experiment that the bottom of the recess may be processed into a desired shape by the etching.

(Third Experiment)

In a third experiment, the substrate W of FIG. 8 was prepared which includes the second region R2 containing silicon oxide (SiO$_x$), the first region R1 containing silicon nitride (SiN$_x$), and the underlying region UR containing silicon nitride (SiN$_x$). Then, step ST2 was performed on the substrate W by using the plasma processing apparatus 1. As a result, the recess RS was formed in the second region R2. In step ST2, the processing gas is a mixed gas of fluorocarbon gas, oxygen gas, tungsten hexafluoride gas (WF$_6$), and argon gas. Further, the flow rate ratio of the tungsten hexafluoride gas (WF$_6$) is higher than the flow rate ratio of the fluorocarbon gas, and higher than the flow rate ratio of the oxygen gas. In step ST2, the RF power HF and the RF power LF illustrated in FIG. 7 were applied.

(Fourth Experiment)

In a fourth experiment, the same method as that of the third experiment was executed, except that in step ST2, tungsten hexafluoride gas (WF$_6$) was removed from the processing gas, and the RF power HF and the RF power LF were kept constant. That is, in step ST2, the processing gas is a mixed gas of fluorocarbon gas, oxygen gas, and argon gas.

(Cross Section)

Figure 12A:
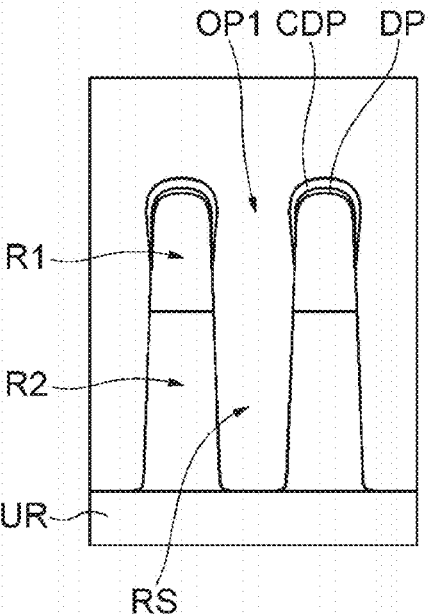
FIGS. 12A to 12D are views illustrating an example of the cross section of a substrate obtained by performing an etching method in third and fourth experiments.
Figure 12B:
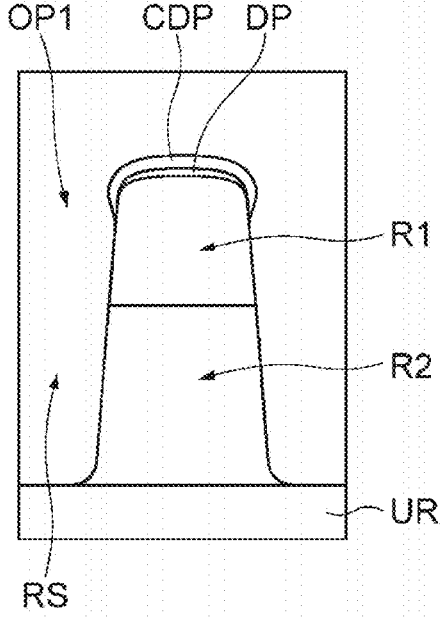

Cross-sectional TEM images of the substrate W obtained by executing the methods in the third and fourth experiments were observed. FIGS. 12A and 12B are views illustrating an example of the cross section of the substrate obtained by executing the etching method in the third experiment. FIG. 12A illustrates the cross section in a region where patterns are densely formed. FIG. 12B illustrates the cross section in a region where an isolated pattern is formed. In FIGS. 12A and 12B, it is confirmed that the tungsten-containing film DP and the carbon-containing film CDP are formed on the first region R1. The carbon-containing film CDP is formed to cover the tungsten-containing film DP. It is also confirmed that only the carbon-containing film CDP is formed to be very thin on the side wall of the recess RS formed in the second region R2.

Figure 12C:
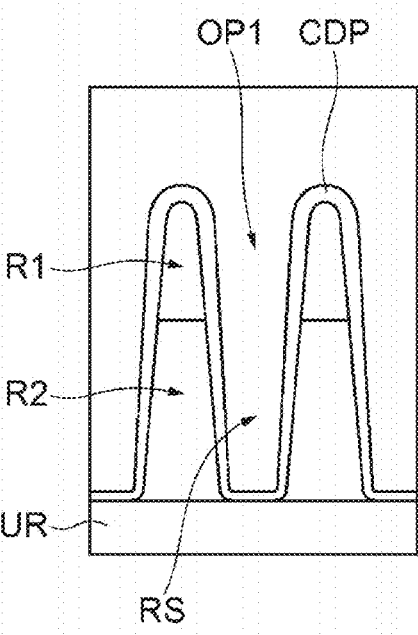
Figure 12D:
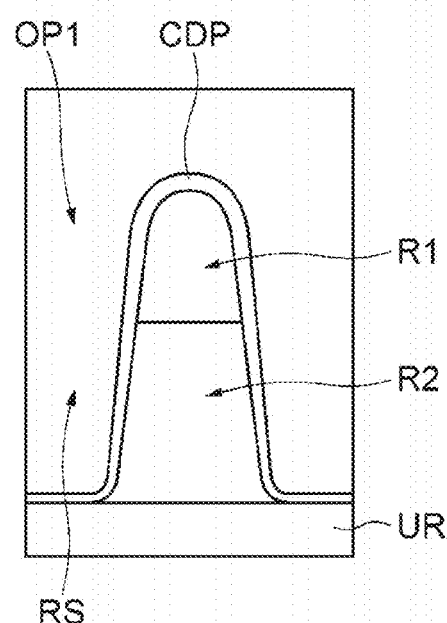

FIGS. 12C and 12D are views illustrating an example of the cross section of the substrate obtained by executing the etching method in the fourth experiment. FIG. 12C illustrates the cross section in a region where patterns are densely formed. FIG. 12D illustrates the cross section in a region where an isolated pattern is formed. In FIGS. 12C and 12D, no tungsten-containing film DP is confirmed on the first region R1, and the carbon-containing film CDP is confirmed. Further, the carbon-containing film CDP is confirmed on the side wall of the recess RS formed in the second region R2.

In FIG. 12A, the value obtained by subtracting the dimension of the top surface of the second region R2 from the dimension of the bottom surface of the second region R2 is 4.0 nm. In FIG. 12C, the value obtained by subtracting the dimension of the top surface of the second region R2 from the dimension of the bottom surface of the second region R2 is 5.1 nm. In FIG. 12B, the value obtained by subtracting the dimension of the top surface of the second region R2 from the dimension of the bottom surface of the second region R2 is 8.5 nm. In FIG. 12D, the value obtained by subtracting the dimension of the top surface of the second region R2 from the dimension of the bottom surface of the second region R2 is 12.4 nm. Thus, in the third experiment, the side wall of the recess RS is close to a vertical shape, as compared with that in the fourth experiment. It is understood that in the fourth experiment, the linear etching is hardly performed due to the carbon-containing film CDP formed on the side wall of the recess RS.

(Etching Selection Ratio)

By measuring the etching amount of the first region R1 and the etching amount of the second region R2, the etching selection ratio of the second region R2 to the first region R1 is calculated. In the third experiment, the etching selection ratio for the region of FIG. 12A is 3.7. In the fourth experiment, the etching selection ratio for the region of FIG. 12C is 2.7. In the third experiment, the etching selection ratio for the region of FIG. 12B is 4.5. In the fourth experiment, the etching selection ratio for the region of FIG. 12D is 4.2. Thus, it may be confirmed that the etching selection ratio may be improved in the third experiment, as compared with the fourth experiment. This is believed to be because the first region R1 is hardly etched due to the tungsten-containing film DP in the third experiment.

15

(Fifth Experiment)

In a fifth experiment, the substrate W having the structure of FIG. 4 was prepared. The substrate W includes the first region R1 containing silicon nitride (SiN$_x$) and the second region R2 containing silicon oxide (SiO$_x$). The substrate W has an opening OP having a relatively large dimension (hereinafter, a long pattern) and an opening OP having a relatively small dimension (hereinafter, a short pattern). Then, the first step ST21 and the second step ST22 were performed on the substrate W by using the plasma processing apparatus 1 (see FIG. 10).

In the first step ST21, the second region R2 was etched, while forming the tungsten-containing film DP on the first region R1, so that a slit having a depth of about 20 nm was formed in the recess R1$a$ (see FIG. 5). In the first step ST21, the processing gas is a mixed gas of fluorocarbon gas, oxygen (O$_2$) gas, argon gas, and tungsten hexafluoride gas (WF$_6$). The flow rate ratio of the tungsten hexafluoride gas (WF$_6$) is higher than the flow rate ratio of the fluorocarbon gas, and higher than the flow rate ratio of the oxygen gas. The RF power HF supplied to the plasma processing apparatus 1 is 0 W. The RF power LF supplied to the plasma processing apparatus 1 is 400 W. Thus, the ion energy of plasma is relatively large.

In the second step ST22, the second region R2 was etched, while forming the tungsten-containing film DP on the first region R1, so that a slit having a depth of about 70 nm was formed in the recess R1$a$. In the second step ST22, the processing gas is a mixed gas of fluorocarbon gas, oxygen gas, argon gas, and tungsten hexafluoride gas (WF$_6$). The flow rate ratio of the tungsten hexafluoride gas (WF$_6$) is higher than the flow rate ratio of the fluorocarbon gas, and higher than the flow rate ratio of the oxygen gas. The RF power HF and the RF power LF are supplied to the plasma processing apparatus 1 according to the timing chart of FIG. 7. In the first period PA, the high power H2 is 800 W, and the low power L1 is 50 W. In the third period PC, the low power L2 is 0 W, and the high power H1 is 100 W. Thus, the average value of the RF power LF in the second step ST22 is lower than the RF power LF in the first step ST21.

(Sixth Experiment)

In a sixth experiment, the same substrate W as that in the fifth experiment was prepared. Then, the step ST2 was performed on the substrate W by using the plasma processing apparatus 1. The step ST2 includes an etching step and a deposition step. The etching step and the deposition step are sequentially performed.

In the etching step, the second region R2 was etched, while forming the tungsten-containing film DP on the first region R1, so that a slit having a depth of about 20 nm was formed in the recess R1$a$ (see FIG. 5). The process conditions of the etching step are the same as the process conditions (BSL conditions) of the second step ST22 of the fifth experiment.

In the deposition step, the second region R2 was etched, while forming a deposition film on the tungsten-containing film DP, so that a slit having a depth of about 70 nm was formed in the recess Ria. The deposition step includes the etching step of the sixth experiment and a carbon-containing film deposition step. In the carbon-containing film deposition step, the processing gas is a mixed gas of carbon monoxide (CO) gas and argon vas. The RF power HF supplied to the plasma processing apparatus 1 is 800 W. The RF power LF supplied to the plasma processing apparatus 1 is 0 W.

16

(Experimental Result)

Cross-sectional TEM images of the substrate W on which etching was performed in the fifth and sixth experiments were observed. In the long pattern of the fifth experiment, the decrease amount (etching amount) of the first region R1 after the first step ST21 was 4.9 nm, and the decrease amount of the first region R1 after the second step ST22 was 7.3 nm. Thus, the decrease amount of the first region R1 increased by 2.4 nm by the second step ST22.

Meanwhile, in the long pattern of the sixth experiment, the decrease amount of the first region R1 after the etching step was 2.8 nm, and the decrease amount of the first region R1 after the deposition step was 3.8 nm. Thus, the decrease amount of the first region R1 increased by 1.0 nm by the deposition step.

In the short pattern of the fifth experiment, the decrease amount of the first region R1 after the first step ST21 was 6.7 nm, and the decrease amount of the first region R1 after the second step ST22 was 10.2 nm. Thus, the decrease amount of the first region R1 increased by 3.5 nm by the second step ST22.

Meanwhile, in the short pattern of the sixth experiment, the decrease amount of the first region R1 after the etching step was 4.3 nm, and the decrease amount of the first region R1 after the deposition step was 10.4 nm. Thus, the decrease amount of the first region R1 increased by 6.1 nm by the deposition step. Accordingly, in the short pattern of the fifth experiment, the increase in decrease amount of the first region R1 by the second step ST22 may be reduced, as compared with the sixth experiment. This is believed to be because, in the fifth experiment, the ion energy of plasma in the first step ST21 is high so that a thick tungsten-containing film DP may be formed in the short pattern.

In the fifth experiment, after the second step ST22, the width of the slit (the width of the recess R1$a$) in the short pattern was 12.8 nm, and the width of the slit in the long pattern was 9.4 nm. Thus, the difference LtS between the width of the slit in the short pattern and the width of the slit in the long pattern is 3.4 nm.

Meanwhile, in the sixth experiment, after the second step ST22, the width of the slit in the short pattern was 13.8 nm, and the width of the slit in the long pattern was 8.7 nm. Thus, the difference LtS between the width of the slit in the short pattern and the width of the slit in the long pattern is 5.1 nm. Accordingly, in the fifth experiment, the difference LtS may be reduced, as compared with the sixth experiment.

(Seventh Experiment)

In a seventh experiment, the same substrate W as that in the fifth experiment was prepared. Then, the first step ST21 was performed on the substrate W by using the plasma processing apparatus 1 (see FIG. 10). While the processing gas of the first step ST21 in the fifth experiment includes oxygen gas, the processing gas of the first step ST21 in the seventh experiment includes hydrogen (H$_2$) gas.

In the first step ST21, the second region R2 was etched, while forming the tungsten-containing film DP on the first region R1, so that a slit having a depth of about 20 nm was formed in the recess R1$a$ (see FIG. 5). In the first step ST21, the processing gas is a mixed gas of fluorocarbon gas, hydrogen gas, argon gas, and tungsten hexafluoride gas (WF$_6$). Further, the flow rate ratio of the tungsten hexafluoride gas (WF$_6$) is higher than the flow rate ratio of the fluorocarbon gas, and lower than the flow rate ratio of the hydrogen gas. The RF power HF supplied to the plasma processing apparatus 1 is 200 W. The RF power LF supplied to the plasma processing apparatus 1 is 100 W.

US 12,575,351 B2

17

(Experimental Result)

A cross-sectional TEM image of the substrate W on which etching was performed in the seventh experiment was observed. In the long pattern of the seventh experiment, the decrease amount of the first region R1 after the first step ST21 was 2.7 nm, and the decrease amount of the first region R1 after the first step ST21 in the fifth experiment was smaller than 4.9 nm.

In the fifth experiment, the thickness of the tungsten-containing film DP formed on the first region R1 after the first step ST21 was 4.3 nm. In the seventh experiment, the thickness of the tungsten-containing film DP formed on the first region R1 after the first step ST21 was 4.9 nm. Thus, in the seventh experiment, the thickness of the tungsten-containing film DP is larger than that in the fifth experiment.

The tungsten-containing film DP formed on the first region R1 was analyzed by an X-ray photoelectron spectroscopy (XPS), for the substrate W on which the first step ST21 was performed in the fifth and seventh experiments. In the fifth experiment, the composition ratio of tungsten was 2.4 atom %. In the seventh experiment, the composition ratio of tungsten was 5.0 atom %. Thus, the composition ratio of tungsten in the tungsten-containing film DP in the seventh experiment is larger than that in the fifth experiment. This is believed to be because $WO_3$ is reduced by hydrogen so that metallic tungsten is produced.

(Eighth Experiment)

In an eighth experiment, the same substrate W as that in the fifth experiment was prepared. Then, the first step ST21 and the second step ST22 were performed on the substrate W by using the plasma processing apparatus 1 (see FIG. 10). The process conditions of the first step ST21 of the eighth experiment are the same as the process conditions of the first step ST21 of the seventh experiment. The process conditions of the second step ST22 of the eighth experiment are the same as the process conditions (BSL conditions) of the second step ST22 of the fifth experiment.

(Experimental Result)

A cross-sectional TEM image of the substrate W on which etching was performed in the eighth experiment was observed. In the long pattern, the decrease amount of the first region R1 after the second step ST22 in the eighth experiment was 3.9 nm, which was equal to the decrease amount of the first region R1 after the deposition step in the sixth experiment (3.8 nm). In the short pattern, the decrease amount of the first region R1 after the second step ST22 in the eighth experiment was 9.5 nm, which was equal to the decrease amount of the first region R1 after the deposition step in the sixth experiment (10.4 nm).

In the eighth experiment, after the second step ST22, the width of the slit (the width of the recess R1a) in the short pattern was 12.6 nm, and the width of the slit in the long pattern was 8.3 nm. Thus, the difference LtS between the width of the slit in the short pattern and the width of the slit in the long pattern is 4.3 nm. Accordingly, in the eighth experiment, the difference LtS may be reduced, as compared with the sixth experiment.

Since the deposition process of the sixth experiment is not performed in the eighth experiment, the process time of the eighth experiment is shorter than the process time of the sixth experiment.

(Ninth Experiment)

In a ninth experiment, the same substrate W as that in the fifth experiment was prepared. Then, the first step ST21, the third step ST23, and the second step ST22 were performed on the substrate W by using the plasma processing apparatus 1 in the same manner as that in the fifth experiment, except that the third step ST23 is performed (see FIG. 10).

In the third step ST23, a process was performed to expose the tungsten-containing film DP to plasma generated from hydrogen gas (hydrogen plasma processing). The RE power HF supplied to the plasma processing apparatus 1 is 300 W. The RF power LF supplied to the plasma processing apparatus 1 is 0 W. The process time of the third step ST23 is 5 seconds.

(Experimental Result)

A cross-sectional TEM image of the substrate W on which etching was performed in the ninth experiment was observed. In the long pattern of the ninth experiment, the decrease amount of the first region R1 after the first step ST21 was 4.9 nm, and the decrease amount of the first region R1 after the second step ST22 was 6.3 run. Thus, the decrease amount of the first region R1 increased by 1.4 nm by the second step ST22.

In the short pattern of the ninth experiment, the decrease amount of the first region R1 after the first step ST21 was 6.7 nm, and the decrease amount of the first region R1 after the second step ST22 was 9.4 nm. Thus, the decrease amount of the first region R1 increased by 2.7 nm by the second step ST22. In the short pattern of the ninth experiment, the increase in decrease amount of the first region R1 by the second step ST22 may be reduced, as compared with the fifth experiment.

In the ninth experiment, after the second step ST22, the width of the slit in the short pattern (the width of the recess R1a) was 12.7 nm, and the width of the slit in the long pattern was 9.8 nm. Thus, the difference US between the width of the slit in the short pattern and the width of the slit in the long pattern is 2.9 nm.

In the ninth experiment, the thickness of the tungsten-containing film DP formed on the first region R1 after the third step ST23 was about 5.6 nm. Thus, the thickness of the tungsten-containing film DP in the ninth experiment is larger than that in the fifth experiment.

The tungsten-containing film DP formed on the first region R1 was analyzed by an X-ray photoelectron spectroscopy (XPS), for the substrate W on which the first step ST21 and the third step ST23 were performed in the ninth experiment. In the ninth experiment, the composition ratio of tungsten was 12.5 atom %. Thus, in the ninth experiment, the composition ratio of tungsten in the tungsten-containing film DP is larger than that in the fifth experiment. This is believed to be because $WO_3$ is reduced by hydrogen so that metallic tungsten is produced.

(Appendix 1)

An etching method comprising:

preparing a substrate including a first region containing silicon and nitrogen, and a second region containing silicon and oxygen; and etching the second region while forming a tungsten-containing protective layer on the first region, by exposing the first and second regions to a plasma generated from a processing gas containing carbon, fluorine, and tungsten.

(Appendix 2)

The etching method described in Appendix 1, wherein in the etching, the tungsten-containing protective layer remains on the first region after the second region is removed.

(Appendix 3)

The etching method described in Appendix 1 or Therein the processing gas includes a gas containing carbon and fluorine, and a tungsten-containing gas.

(Appendix 4)

The etching method described in Appendix 3, wherein the tungsten-containing gas includes tungsten hexafluoride gas.

(Appendix 5)

The etching method described in Appendix 3 or 4, wherein the gas containing carbon and fluorine includes fluorocarbon gas.

(Appendix 6)

The etching method described in any one of Appendices 1 to 5, wherein the processing gas contains oxygen.

(Appendix 7)

The etching method described in any one of Appendices 1 to 6, wherein the first region has a recess, and the second region is embedded in the recess.

(Appendix 8)

The etching method described in any one of Appendix 7, wherein the etching is performed in a self-aligned contact process.

(Appendix 9)

The etching method described in Appendices 1 to 8, wherein in the etching, a radio-frequency power and a bias power are supplied to a plasma processing apparatus in order to generate the plasma, and the etching includes:

(a) preferentially depositing a tungsten-containing deposit on the first region by setting the radio-frequency power to a first power and setting the bias power to a second power;

(b) performing a transition of setting the radio-frequency power to a third power lower than the first power and setting the bias power to the second power; and (c) etching the second region by setting the radio-frequency power to the third power and setting the bias power to a fourth power higher than the second power.

(Appendix 10)

The etching method described in Appendix 9, wherein a cycle including (a) to (e) is repeated two or more times.

(Appendix 11)

An etching method comprising:

preparing a substrate including silicon nitride having an exposed upper surface and silicon oxide having an exposed upper surface;

exposing the silicon oxide and the silicon nitride to a plasma generated from a processing gas including tungsten hexafluoride gas, thereby forming a protective layer containing tungsten nitride on the silicon nitride; and exposing the silicon oxide and the silicon nitride to the plasma generated from the processing gas including tungsten hexafluoride gas, thereby preferentially etching the silicon oxide to the silicon nitride.

(Appendix 12)

The etching method described in Appendix 11, wherein the processing gas includes fluorocarbon gas.

(Appendix 13)

A plasma processing apparatus comprising:

a chamber;

a substrate support configured to support a substrate in a chamber;

a gas supply configured to supply a processing gas containing carbon, fluorine, and tungsten into the chamber;

a plasma generator configured to generate a plasma from the processing gas in the chamber; and a controller, wherein the controller is configured to control the gas supply and the plasma generator to perform a series of processes including:

preparing a substrate including a first region containing silicon and nitrogen, and a second region containing silicon and oxygen; and etching the second region while forming a tungsten-containing protective layer on the first region, by exposing the first and second regions to a plasma generated from a processing gas containing carbon, fluorine, and tungsten.

(Appendix 14)

An etching method comprising:

preparing a substrate including a first region containing silicon and a second region containing silicon and oxygen; and etching the second region while forming a tungsten-containing protective layer on the first region, by exposing the first and second regions to a plasma generated from a processing gas containing carbon, fluorine, and tungsten, wherein the etching includes first and second steps, in the first step, a first tungsten-containing deposit is formed on the first region, by supplying a bias power to the plasma processing apparatus, and the bias power is a fifth power, and in the second step, the second region is etched while forming a second tungsten-containing deposit on the first tungsten-containing deposit, by supplying a radio-frequency power and a bias power to the plasma processing apparatus, and the bias power in the second step is a sixth power lower than the fifth power.

(Appendix 15)

The etching method described in Appendix 14, wherein the etching includes a third step between the first and second steps, and in the third step, the first tungsten-containing deposit is exposed to a plasma generated from a processing gas including a hydrogen-containing gas.

(Appendix 16)

An etching method comprising:

preparing a substrate including a first region containing silicon and a second region containing silicon and oxygen; and etching the second region while forming a tungsten-containing protective layer on the first region, by exposing the first and second regions to a plasma generated from a processing gas containing carbon, fluorine, and tungsten, wherein the etching includes first and second steps, in the first step, a first tungsten-containing deposit is formed on the first region, by using the processing gas including a hydrogen-containing gas, and in the second step, the second region is etched while forming a second tungsten-containing deposit on the first tungsten-containing deposit, by using the processing gas including an oxygen-containing gas.

According to an embodiment, it is possible to provide an etching method and a plasma processing apparatus, which are capable of improving an etching selectivity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:

preparing a substrate including a first region containing silicon and nitrogen, and a second region containing silicon and oxygen; and etching the second region while forming a tungsten-containing protective layer on the first region, by exposing the first and second regions to a plasma generated from a processing gas containing carbon, fluorine, and tungsten, wherein the first region has a recess, and the second region is embedded in the recess.

2. The etching method according to claim 1, wherein in the etching, the tungsten-containing protective layer remains on the first region after the second region is removed.

3. The etching method according to claim 1, wherein the processing gas includes a gas containing carbon and fluorine, and a tungsten-containing gas.

4. The etching method according to claim 3, wherein the tungsten-containing gas includes tungsten hexafluoride gas.

5. The etching method according to claim 3, wherein the gas containing carbon and fluorine includes fluorocarbon gas.

6. The etching method according to claim 1, wherein the processing gas contains oxygen.

7. The etching method according to claim 1, wherein the etching is performed in a self-aligned contact process.

8. The etching method according to claim 1, wherein in the etching, a radio-frequency power and a bias power are supplied to a plasma processing apparatus in order to generate the plasma, and the etching includes:

(a) depositing a tungsten-containing deposit on the first region by setting the radio-frequency power to a first power and setting the bias power to a second power;

(b) performing a transition of setting the radio-frequency power to a third power lower than the first power and setting the bias power to the second power; and (c) etching the second region by setting the radio-frequency power to the third power and setting the bias power to a fourth power higher than the second power.

9. The etching method according to claim 8, wherein a cycle including (a) to (c) is repeated two or more times.

10. An etching method comprising:

preparing a substrate including silicon nitride having an exposed upper surface and silicon oxide having an exposed upper surface;

exposing the silicon oxide and the silicon nitride to a plasma generated from a processing gas including tungsten hexafluoride gas, thereby forming a protective layer containing tungsten nitride on the silicon nitride; and exposing the silicon oxide and the silicon nitride to the plasma generated from the processing gas including tungsten hexafluoride gas, thereby etching the silicon oxide to the silicon nitride, wherein the silicon nitride has a recess, and the silicon oxide is embedded in the recess.

11. The etching method according to claim 10, wherein the processing gas includes fluorocarbon gas.

12. A plasma processing apparatus comprising:

a chamber;

a substrate support configured to support a substrate in a chamber;

a gas supply configured to supply a processing gas containing carbon, fluorine, and tungsten into the chamber;

a plasma generator configured to generate a plasma from the processing gas in the chamber; and a controller, wherein the controller is configured to control the gas supply and the plasma generator to perform a series of processes including:

preparing a substrate including a first region containing silicon and nitrogen, and a second region containing silicon and oxygen; and etching the second region while forming a tungsten-containing protective layer on the first region, by exposing the first and second regions to a plasma generated from a processing gas containing carbon, fluorine, and tungsten, the first region has a recess, and the second region is embedded in the recess.

13. The etching method according to claim 1, wherein the tungsten-containing protective layer forms on an exposed upper surface of the first region.

14. The etching method according to claim 1, wherein the second region is not covered by the tungsten-containing protective layer.

15. The etching method according to claim 10, wherein the protective layer containing tungsten nitride is formed on the exposed upper surface of the silicon nitride.

16. The etching method according to claim 10, wherein the silicon oxide is not covered by the protective layer containing tungsten nitride.

17. The plasma processing apparatus according to claim 12, wherein the tungsten-containing protective layer forms on an exposed upper surface of the first region.

18. The plasma processing apparatus according to claim 12, wherein the second region is not covered by the tungsten-containing protective layer.

* * * * *